United States Patent [19]
Kasahara et al.

[11] Patent Number: 5,527,732
[45] Date of Patent: Jun. 18, 1996

[54] METHOD FOR FABRICATING SEMICONDUCTOR LASER AND PHOTO DETECTING ARRAYS FOR WAVELENGTH DIVISION MULTIPLEXING OPTICAL INTERCONNECTIONS

[75] Inventors: Kenichi Kasahara; Shigeo Sugou, both of Tokyo, Japan

[73] Assignee: NEC Corporation, Tokyo, Japan

[21] Appl. No.: 275,199

[22] Filed: Jul. 14, 1994

[30] Foreign Application Priority Data

Jul. 14, 1993 [JP] Japan .................................. 5-173514

[51] Int. Cl.$^6$ .................................. H01L 21/20
[52] U.S. Cl. .................................. 437/3; 437/127; 437/129
[58] Field of Search .................................. 437/129, 127, 437/3

[56] References Cited

U.S. PATENT DOCUMENTS

| | | | |
|---|---|---|---|
| 4,976,539 | 12/1990 | Carlson et al. | 356/5 |
| 5,023,944 | 6/1991 | Bradley | 455/611 |
| 5,228,103 | 7/1993 | Chen et al. | 385/14 |
| 5,376,580 | 12/1994 | Kish et al. | 437/127 |
| 5,453,405 | 9/1995 | Fan et al. | 437/228 |

OTHER PUBLICATIONS

By C. Chang–Hasnain et al., "Multiple Wavelength Tunable Surface–Emitting Laser Arrays", *IEEE Journal of Quantum Electronics*, Jun. 1991, vol. 27, No. 6, pp. 1368–1376.

By H. Kosaka et al., "Pixels Consisting of Double Vertical–Cavity Detector and Single Vertical–Cavity Laser Sections for 2–D Bidirectional Optical Interconnections", *Jpn. J. Appl. Phys*, 1993, vol. 32, pp. 600–603.

*Primary Examiner*—R. Bruce Breneman
*Assistant Examiner*—Linda J. Fleck
*Attorney, Agent, or Firm*—Young & Thompson

[57] ABSTRACT

The invention provides a method of fabricating two dimensional semiconductor surface emitting laser and photo detector arrays for wavelength division multiplexing optical interconnections. A first stacked multiple layer structure on a first semiconductor substrate. An intermediate layer is grown on the first stacked multiple layer structure. A second stacked multiple layer structure is grown on the intermediate layer. A second semiconductor substrate is adhered on a top of the second stacked multiple layer structure by a heat treatment thereby a wafer is grown in successive growth processes to receive a selective wet etching so that the intermediate layer only is selectively etched to separate the first and second stacked multiple layer structures from one another, followed by forming surface emitting laser arrays and photo detector arrays on the first and second semiconductor substrates respectively.

9 Claims, 6 Drawing Sheets

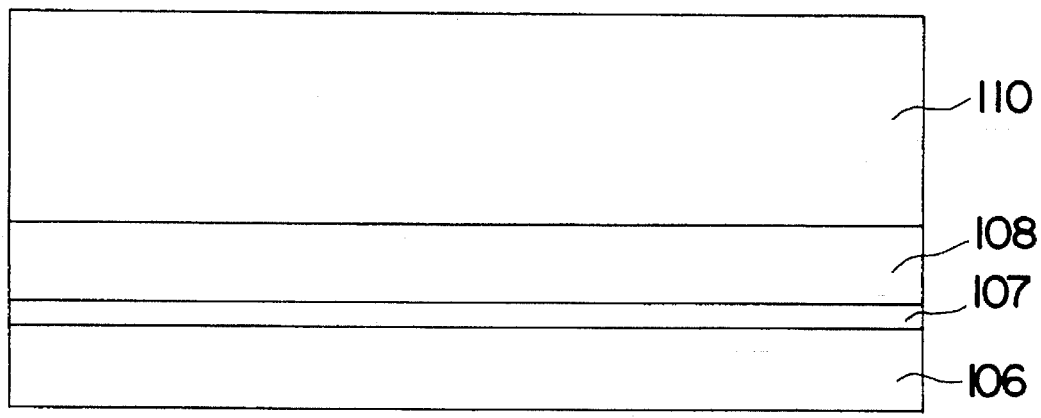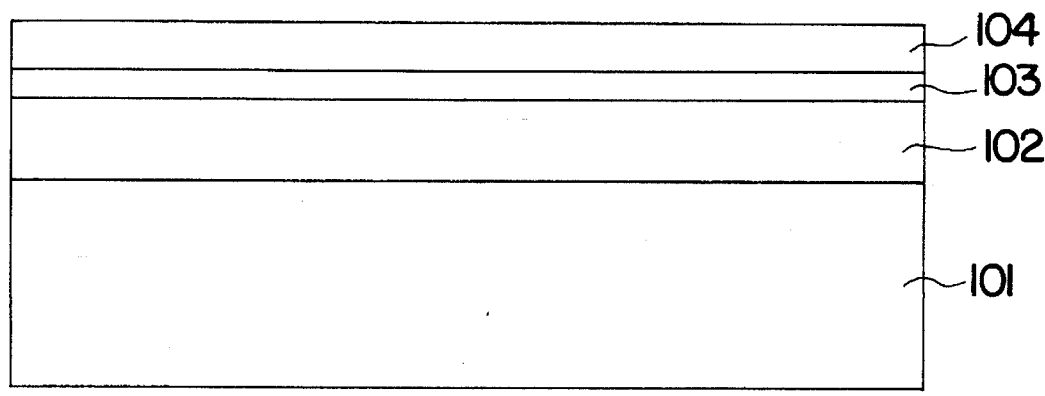
FIG. IC

METHOD FOR FABRICATING SEMICONDUCTOR LASER AND PHOTO DETECTING ARRAYS FOR WAVELENGTH DIVISION MULTIPLEXING OPTICAL INTERCONNECTIONS

BACKGROUND OF THE INVENTION

The invention relates to semiconductor laser and photo detecting arrays for wavelength division multiplexing interconnection system.

Implementation of wavelength division multiplexing optical interconnections are very important for high speed and high density optical transmission and processing. The value and importance in development of the semiconductor optical devices necessary for wavelength division multiplexing optical interconnections are on the increase as the requirement of the realization for the wavelength division multiplexing optical interconnections are on the increase. The use of the wavelength division multiplexing permits for a great amount of optical informations to be transmitted through a single or a small number of optical fibers or optical wave guides for high speed and high density processing and transmission of the optical informations. Such the optical interconnections requires a large number of laser and photo detector devices which are for optical waves having different wavelengths to each other. For that purpose, various types of wavelength tunable semiconductor lasers and filters has been on the development. Conventionally, the developments of edge emitting laser devices such as the distributed feedback lasers and the distributed Bragg reflector lasers have been influential. The use of such the edge emitting laser devices for wavelength division multiplexing optical interconnections has have disadvantages in the difficulty in the device fabrications and a relatively narrow tunable wavelength band width, for example, approximately several ten angstroms only.

On the other hand, vertical to surface emitting lasers are more attractive than the above edge emitting laser devices as being suitable for two dimensional integration or two dimensional arrays for an achievement of multiple channels with a large number of different wavelengths. The two dimensional arrays comprising a great number of the surface emitting lasers for emitting laser beams with different wavelengths may be formed in a single wafer to form the two dimensional arrays. It is disclosed in IEEE Quantum Electronics vol. 27, No. 6 pp. 1368–1376 to align the two dimensional arrays of the surface emitting lasers including distributed Bragg reflector mirrors comprising alternate large band gap and small band gap semiconductor layers whose thickness is gradient across the wafer. Since the vertical cavity surface emitting laser wavelength depends sensitively on the cavity length, the gradient of the thickness of each of the alternate large band gap and small band gap semiconductor layers forming the distributed Bragg reflector mirrors involved in the vertical cavity surface emitting laser. One way to generate such thickness variation is to keep the wafer stationary during part of the molecular beam epitaxy growth. The thickness variation is caused by the variation of the amount of atoms arriving at the wafer surface in the direction parallel to the plane of incidence of the source.

As the photo detector, double vertical-cavity detectors are suitable as having a sensitivity in a relatively wide range wavelength. It is disclosed in Japan Journal of Applied Physics vol. 32, pp. 600–603, Part 1, No. 1B, January 1993 to use double vertical cavity photo detector and single vertical cavity laser sections for two dimensional bi-directional optical interconnections. The vertical cavity structure involved in each the laser and detector sections has an absorption layer sandwiched between top and bottom distributed Bragg reflector mirrors each of which comprises alternate large band gap and small band gap semiconductor layers having a thickness of a quarter of the wavelength. Further, the double vertical cavity structure involved in the photo detector section has a spacer layer in the bottom distributed Bragg reflector mirror in which the spacer layer has a thickness of a half of the wavelength. The existence of the spacer layer permits the photo detector to show a sensitivity in the wide range of the wavelength.

The serious problem with the prior arts are in the difficulty in application for the wavelength division multiplexing optical interconnections. The realization of the wavelength division multiplexing optical interconnections between the two dimensional laser and photo detector arrays necessarily requires the exact correspondence between the wavelength of the laser beam emitted from individual lasers in the arrays and the wavelength of corresponding photo detectors in the arrays. The wavelengths of both the vertical cavity surface emitting laser and the double vertical cavity photo detector are extremely sensitive to a slight variation of the thickness of any layers constituting the laser or detector device. Actually, it would extremely be difficult to implement such a precise control of conditions for device fabrications as to suppress any variation of the thicknesses of any layers constituting the laser or photo detector device. Particularly, the strict control of the thickness of the layers constituting the distributed Bragg reflectors are very important as described above. The above layers involved in the photo detector and laser devices are grown by molecular beam epitaxy. When the layers constituting the surface emitting laser device and the layers constituting the photo detector device are grown in different or not successive fabrication steps by molecular beam epitaxy, a variation in the thicknesses of the layers between the laser and photo detector sections necessarily appears as the conditions in the growth of the layers by molecular beam epitaxy are unavoidably varied between the different or non-successive growth steps. Even if such the variation of the conditions for the growth of the layers in the different or non-successive growth steps by the molecular beam epitaxy is extremely slight, it is no longer possible to obtain the required exact correspondence in the wavelengths between the laser device and the photo detector device. The laser device and the photo detector device are respectively different wafers, two non-successive growths are necessary for the laser device and the photo detector device respectively. This results in a difficult in obtaining the correspondence in the wavelength between the laser device and the photo detector device which are paired to each other.

It is therefore required to grow the layers for the laser device and the photo detector device in successive growth steps to obtain the exact correspondence in the wavelengths between the laser device and the photo detector device.

SUMMARY OF THE INVENTION

Accordingly, it is an object of the present invention to provide a novel method of fabricating surface emitting laser arrays and photo detector arrays useful for wavelength division multiplexing optical interconnection system.

It is an another object of the present invention to provide novel surface emitting laser arrays and photo detector arrays useful for wavelength division multiplexing optical interconnections.

It is a further object of the present invention to provide a wavelength division multiplexing optical interconnection system including surface emitting laser arrays and photo detector arrays.

The above and other objects, features and advantages of the present inventions will be apparent from the following descriptions.

The invention provides a wavelength division multiplexing optical interconnection system comprising two dimensional surface emitting laser arrays aligned in matrix formed on a first semiconductor substrate in which individual layers show a laser emission in different wavelengths from each other, two dimensional photo detector arrays aligned in matrix formed on a second semiconductor substrate in which individual photo detectors make a detection of lasers with different wavelength from each other, while each pair of surface emission laser and photo detector has the complete correspondent resonant wavelength, and one dimensional optical fiber arrays connecting between the laser arrays and photo detector arrays through multiplexers and dimultiplexers. The two dimensional surface emitting laser arrays and the two dimensional photo detector arrays are fabricated by the following steps. A first stacked multiple layer structure for the two dimensional surface emitting laser arrays is grown on the first semiconductor substrate in which the first stacked multiple layer structure has at least a predetermined thickness gradient. An intermediate layer is formed on the first stacked multiple layer structure in which the intermediate layer is made of a semiconductor whose etching rate is much higher than an etching rate of the first stacked multiple layers. A second stacked multiple layer structure for the two dimensional photo detector arrays is is grown on the intermediate layer in which the second stacked multiple layer structure has at least a predetermined thickness gradient. A second semiconductor substrate is adhered on a top of the second stacked multiple layer structure by a heat treatment thereby a wafer is grown in successive growth processes. The wafer is subjected to a selective wet etching so that the intermediate layer only is selectively etched to separate the first and second stacked multiple layer structures from one another. Surface emitting laser arrays and photo detector arrays are formed on the first and second semiconductor substrates respectively.

BRIEF DESCRIPTION OF THE DRAWINGS

Preferred embodiment of the present invention will hereinafter be described in detail with reference to the accompanying drawings.

FIGS. 1A to 1D are illustrative of fabrication steps of two dimensional laser arrays and two dimensional photo detector arrays for wavelength division multiplexing optical interconnections according to the present invention.

PREFERRED EMBODIMENTS OF THE INVENTION

Figure 5:
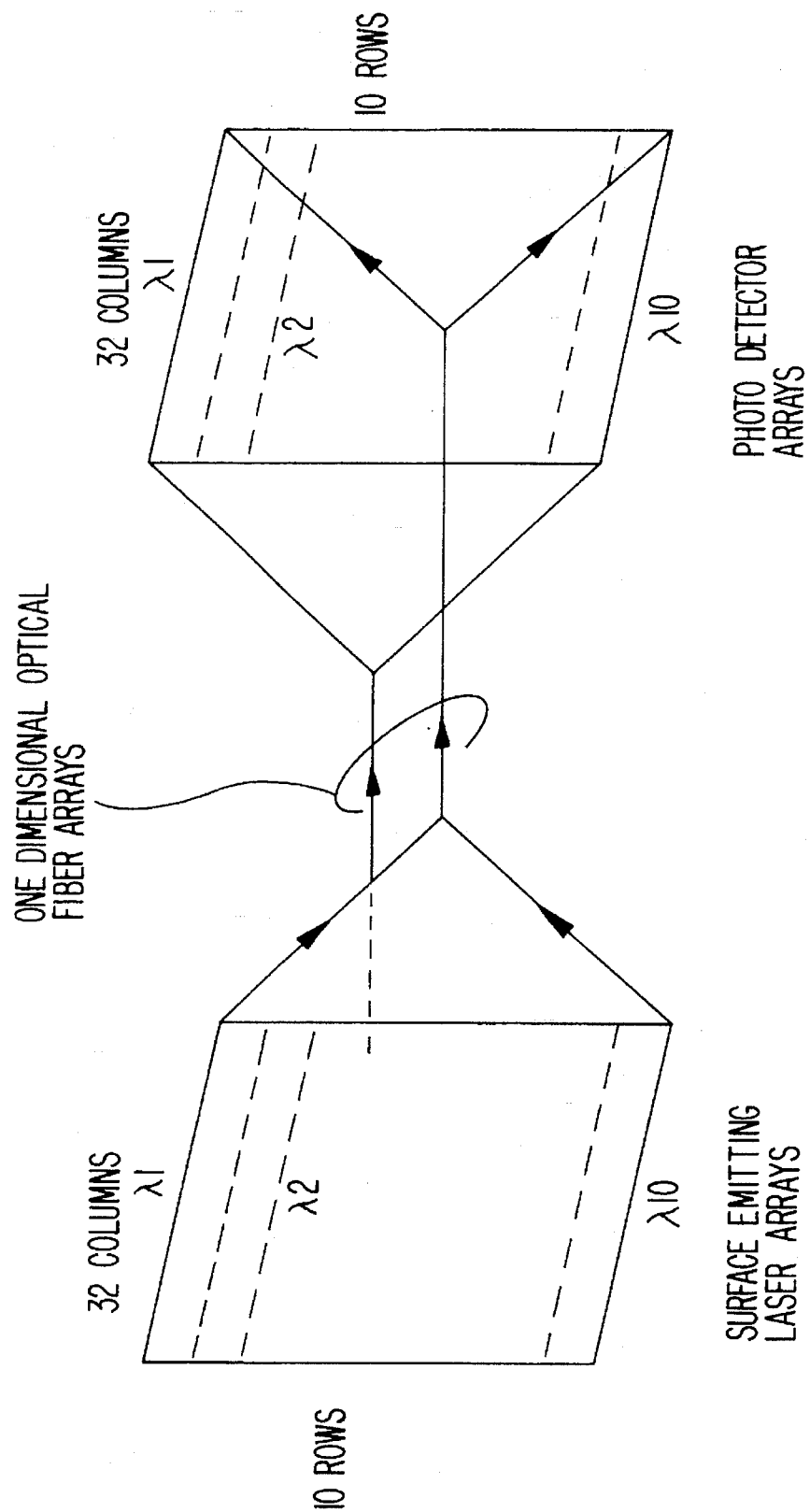
FIG. 5 is a diagram illustrative of wavelength division multiplexing optical interconnection system including two dimensional laser arrays and two dimensional photo detector arrays according to the present invention.

A preferred embodiment according to the present invention will be described in which there is provided a novel wavelength division multiplexing optical interconnection system including two dimensional laser arrays and separate two dimensional photo detector arrays which are connected through one dimensional optical fiber arrays as illustrated in FIG. 5. The lasers are aligned in a matrix comprising ten rows and thirty two columns. The laser device aligned in the two dimensional arrays may be surface emitting lasers such as a single vertical cavity surface emitting laser. The surface emitting lasers aligned in the same row involved in the two dimensional arrays show an emission of laser beam having the same wavelength, while the surface emitting lasers aligned in different rows show an emission of laser beam having the different wavelength from each other. Each row involved in the two dimensional arrays of the laser section has an alignment of thirty two laser devices emitting the laser beam having a predetermined wavelength. The wavelength of the surface emitting laser devices are determined in each rows of the laser devices. Each of the rows comprising the alignment of the surface emitting laser devices has an individual predetermined wavelength. Namely, the different rows comprising the alignment of the surface emitting lasers have the different wavelength from each other.

Similarly, the photo detectors are also aligned in a matrix comprising ten rows and thirty two columns. The photo detector device aligned in the two dimensional arrays may be a double vertical cavity photo detector. The photo detectors aligned in the same row involved in the two dimensional arrays show an absorption of laser beam having the same wavelength, while the photo detectors aligned in different rows show an absorption of laser beam having the different wavelength from each other. Each row involved in the two dimensional arrays of the photo detector section has an alignment of thirty two photo detector devices emitting the photo detector beam having a predetermined wavelength. The wavelength of the photo detector devices are determined in each rows of the photo detector devices. Each of the rows comprising the alignment of the surface emitting photo detector devices has an individual predetermined wavelength for absorption. Namely, the different rows comprising the alignment of the photo detectors have the different wavelength from each other.

The surface emitting laser arrays and the photo detector arrays are coupled to each other through one dimensional optical fiber arrays comprising an alignment of thirty two optical fibers. Different wavelength laser beams emitted from the surface emitting lasers aligned in each column involved in the two dimensional arrays are multiplexed through a multiplexer which is connected to an optical fiber in which the wavelength multiplexed optical signals including different wavelengths are transmitted. The multiplexed wavelength laser beams transmitted through the optical fiber are divided or dimultiplexed into different wavelength laser beams which are assigned into the corresponding wavelength photo detectors aligned in the column. Thirty two optical fibers connected at its opposite ends to the the multiplexer and the dimultiplexer respectively are provided in the corresponding thirty two columns of the laser and photo detector arrays.

The wavelength of the laser beam emitted from the laser aligned in a row involved in the two dimensional laser arrays has the exact correspondence to the wavelength of the photo detector aligned in the corresponding row involved in the two dimensional photo detector arrays. The exact correspondence in the wavelength between the surface emitting laser and the corresponding photo detector requires the exact correspondence in the thickness between the layers involved in the surface emitting laser and the photo detector. The exact correspondence in the thickness of the layers involved in the surface emitting laser and the photo detector are achieved by a novel fabrication process according to the present invention.

The description will focus on the method of fabricating the surface emitting laser arrays and the photo detector arrays. According to the present invention, stacked layers for the surface emitting laser arrays and stacked layers for the photo detector arrays are grown in successive growth steps. The stacked layers may be grown by molecular beam epitaxy. The surface emitting laser arrays and the photo detector arrays may be formed from a single wafer comprising stacked layers grown on a first semiconductor substrate. First stacked semiconductor layers for the surface emitting laser arrays are grown by molecular beam epitaxy on the semiconductor substrate. An intermediate semiconductor layer is grown by molecular beam epitaxy on the first stacked layers for the surface emitting laser arrays. Second stacked semiconductor layers for the photo detector arrays are subsequently grown by molecular beam epitaxy on the intermediate layer. A second semiconductor substrate is adhered by heat treatment on the top surface of the second stacked semiconductor layers for the photo detector arrays to form a wafer. The wafer is immersed into a wet etchant so that the intermediate semiconductor layer is selectively etched in much higher etching rate than any other semiconductor layers in which the intermediate layer has to be made of such a semiconductor as to be etched by an etchant in much more high etching rate than the etching rate of any other semiconductor layers thereby substantially the intermediate layer only is selectively etched to separate the first stacked layers for the surface emitting laser arrays from the photo detector arrays.

Figure 1A:
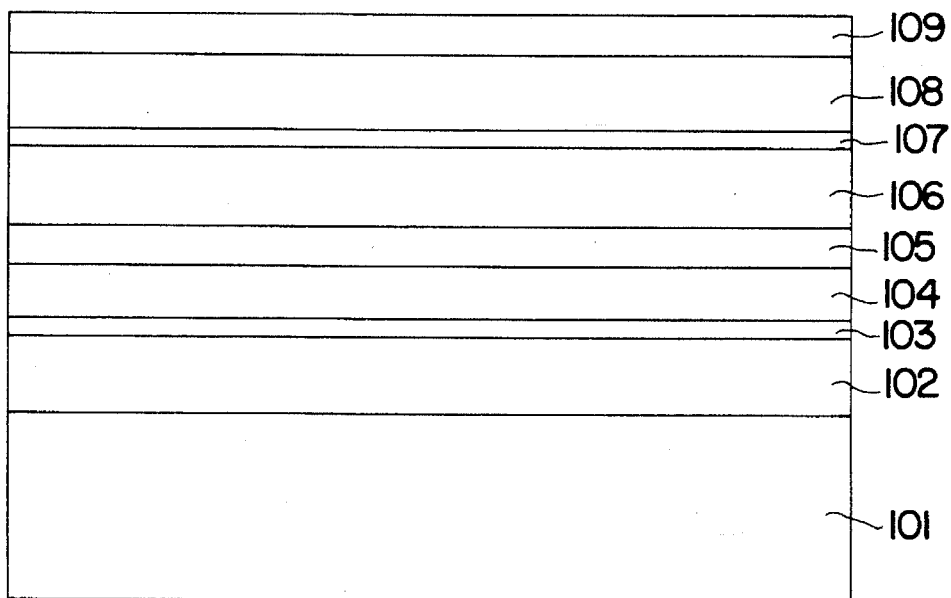

As illustrated in FIG. 1A, an n-GaAs substrate 101 is prepared so that an n-doped distributed Bragg reflector 102 is grown by molecular beam epitaxy on the n-GaAs substrate 101. The n-doped distributed Bragg reflector 102 comprises 23.5 periods of alternate AlAs/GaAs layers which are doped with Si at an impurity concentration of $2 \times 10^{18}$ cm$^{-3}$. Each of the n-AlAs layer and n-GaAs layer has a thickness corresponding to a quater of the wavelength. An active layer 103 made of $In_{0.2}Ga_{0.8}As$ having a thickness approximately corresponding to the wavelength, for example, approximately 0.98 micrometers is grown on the n-doped distributed Bragg reflector 102. A p-doped distributed Bragg reflector 104 is grown by molecular beam epitaxy on the active layer 103. The p-doped distributed Bragg reflector 102 comprises 15 periods of alternate AlAs/GaAs layers which are doped with Be at an impurity concentration of $2 \times 10^{18}$ cm$^{-3}$. Each of the p-AlAs layer and p-GaAs layer has a thickness corresponding to a quater of the wavelength. The stacked layers comprising the n-distributed Bragg reflector 102, the active layer 103 and the p-distributed Bragg reflector are formed for a formation of the surface emitting laser arrays.

Subsequently, an intermediate layer 105 made of AlAs having a thickness of 1 micrometer is grown the above growth method or molecular beam epitaxy. A p-doped distributed Bragg reflector 106 is grown by molecular beam epitaxy on the AlAs intermediate layer 105. The p-doped distributed Bragg reflector 106 comprises 15 periods of alternate AlAs/CaAs layers which are doped with Be at an impurity concentration of $2 \times 10^{18}$ cm$^{-3}$. Each of the p-AlAs layer and p-GaAs layer has a thickness corresponding to a quater of the wavelength. An absorption layer 107 made of $In_{0.2}Ga_{0.8}As$ having a thickness approximately corresponding to the wavelength, for example, approximately 0.98 micrometers is grown on the p-doped distributed Bragg reflector 106. An n-doped distributed Bragg reflector 108 is grown by molecular beam epitaxy on the absorption layer 107. The n-doped distributed Bragg reflector 108 comprises 23.5 periods of alternate AlAs/GaAs layers which are doped with Si at an impurity concentration of $2 \times 10^{18}$ cm$^{-3}$. Each of the n-AlAs layer and n-GaAs layer has a thickness corresponding to a quater of the wavelength, while a spacer layer made of AlAs having a thickness corresponding to a half of the wavelength exists at a 8.5th period from the top of the n-doped distributed Bragg reflector 108 to permit the photo detector to detect a photon in the the wide wavelength range, for example, 50 angstroms. The stacked layers comprising the p-doped distributed Bragg reflector 106, the absorption layer 107 and the n-doped distributed Bragg reflector 108 are formed for a formation of the photo detector arrays. The above fabrication process provides a wafer.

Moreover, a cover layer 109 made of GaAs having a thickness of 1000 angstroms is formed on the top of the n-doped distributed Bragg reflector 109. The cover layer 109 is to protect the stacked layers for the laser and photo detector arrays from suffering any pollution until next fabrication process.

Figure 1B:
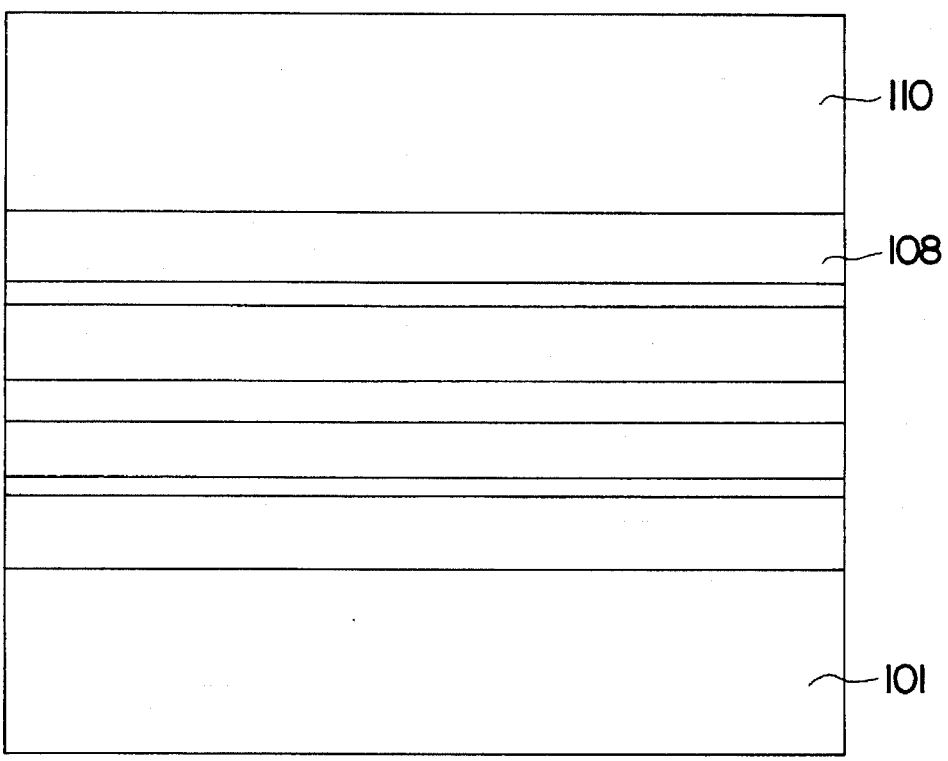

As illustrated in FIG. 1B, a second semiconductor substrate 110 made of n-GaAs is prepared to be subjected to a mirror polishing and subsequent week etching. After removal of the cover layer, the processed second semiconductor substrate 110 is then placed on the top of the wafer for a heat treatment using H$^2$ atmosphere thereby the second semiconductor substrate is securely adhered on the top of the distributed Bragg reflector 108. It is preferable to carried out the heat treatment at a high temperature to obtain a large intensity of the adhesion between the top distributed Bragg reflector 108 and the second semiconductor substrate 110. In this preferred embodiment, the heat treatment is carried out at a temperature of 500° C. so that a crystal bond between the second substrate and the top distributed Bragg reflector with a sufficiently large bonding intensity is obtained.

Figure 3:
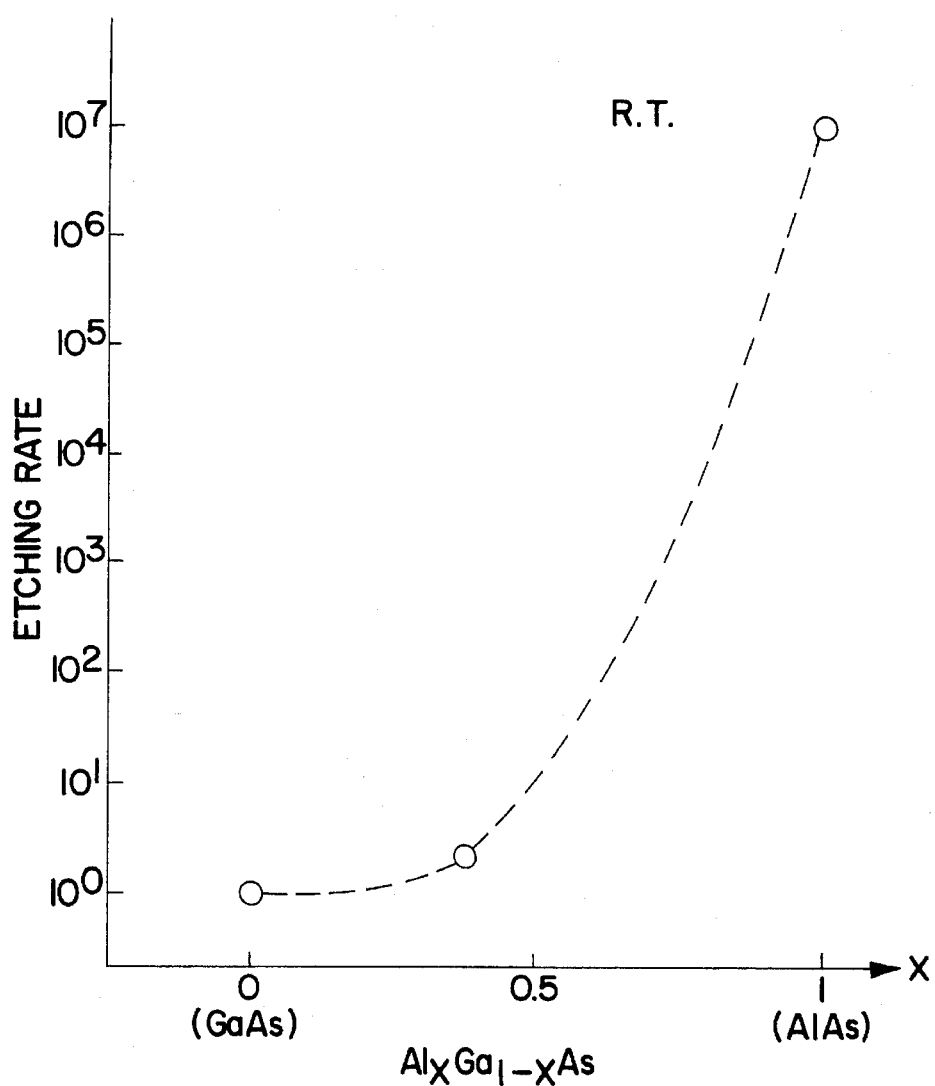
FIG. 3 is a diagram illustrative of an etching rate relative to a buffered HF versus a variation of fraction of AlGaAs.

The wafer is then immersed into a 50% buffered HF so that the intermediate layer only is etched, resulting in a separation of the first stacked layers for the formation of the surface emitting laser arrays and the second stacked layer for the formation of the photo detector arrays as illustrated in FIG. 1C. A relative etching rate of $Al_xGa_{1-x}As$ by the buffered HF at the room temperature is illustrated in FIG. 3, from which it is understood that the etching rate of AlAs is larger by $10^7$ times than the etching rate of GaAs. The intermediate AlAs layer is etched by the Buffered HF in a lateral direction, while the AlAs layers involved in the distributed Bragg reflectors receives almost no etching as having a sufficiently small thickness for suppressing the etching. For example, the quater wavelength thickness of the AlAs layers involved in the distributed Bragg reflectors is only 830 angstroms. The wet etching by use of the Buffered HF to the intermediate layer results in the separation of the stacked layers for the surface emitting laser arrays from the stacked layers for the photo detector arrays.

Figure 1D:
Figure 1D:
Figure 1D:
Figure 1D:
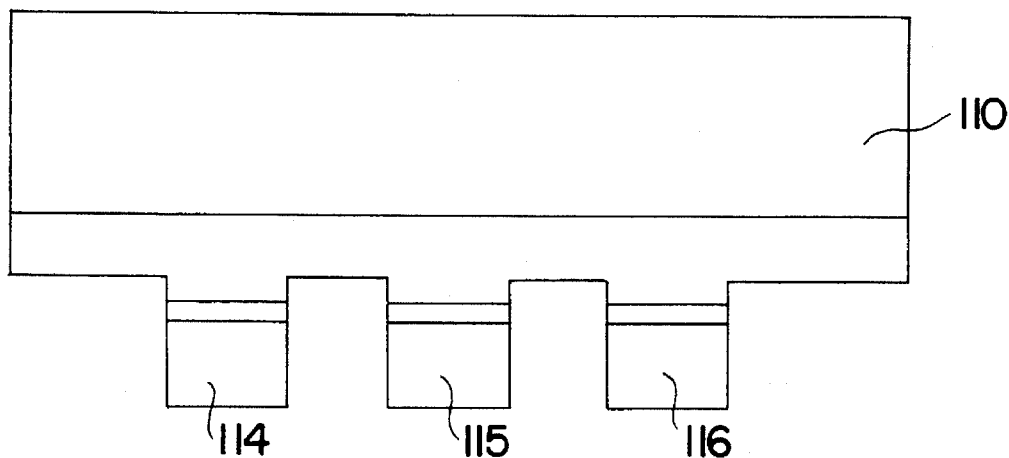
Figure 1D:
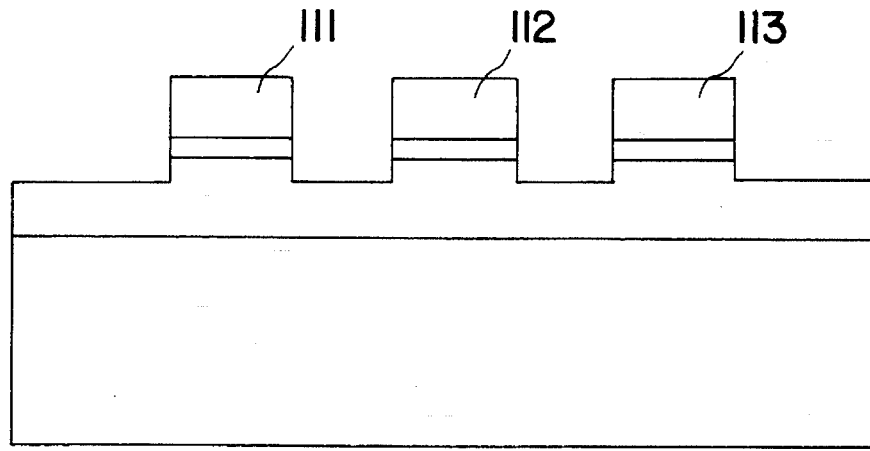
Figure 1D:
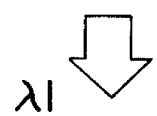
Figure 1D:
Figure 1D:
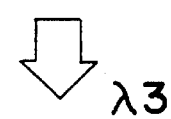
Figure 2:
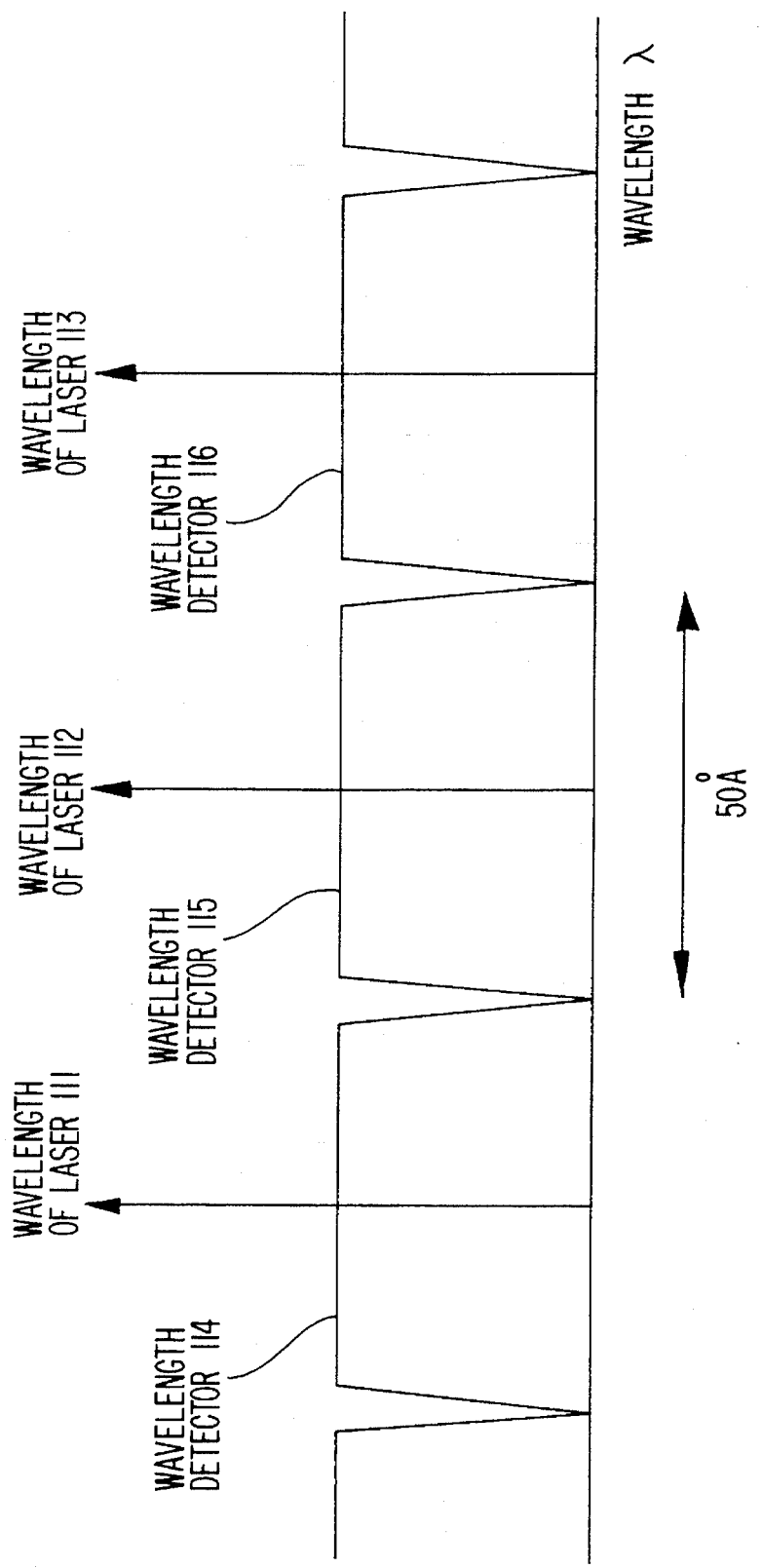
FIG. 2 is a diagram illustrative of wavelengths of individual pairs of laser and photo detector devices aligned in individual two dimensional arrays.

The first stacked layers are subjected to a dry etching to form a plurality of surface emitting lasers 111, 112 and 113 aligned at a pitch of 250 micrometers on the first semiconductor substrate as illustrated in FIG. 1D. Further, the second stacked layers are subjected to a dry etching to form a plurality of photo detectors 114, 115 and 116 aligned on the bottom of the second semiconductor.

Figure 4:
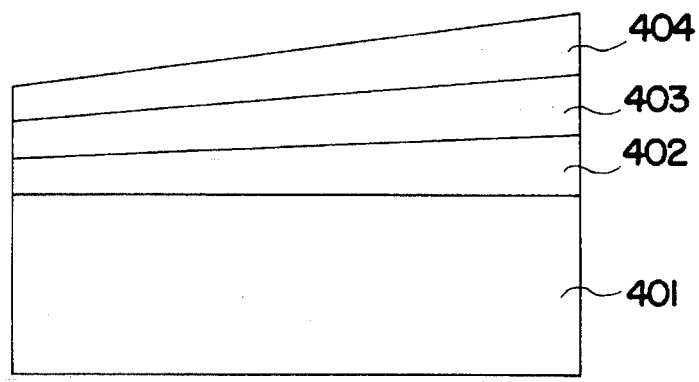
FIG. 4 is a fragmentary cross sectional elevation view illustrative of semiconductor layers with thickness gradients grown by molecular beam epitaxy.

The layers constituting the distributed Bragg reflectors in both the surface emitting laser arrays and the photo detector arrays were grown in the above molecular beam epitaxy processes by use of the conventional growth method as disclosed in IEEE Journal of Quantum Electronics, vol. 27, No. 6, June 1991 so that the layers have the constant thickness gradient as illustrated in FIG. 4 to provide a constant pitch wavelength variation in the emitted laser and the absorbed layer between the surface emitting laser arrays and the photo detector arrays. The difference in the wavelength between the adjacent two lasers or between the adjacent two photo detectors are 50 angstroms. The exact correspondence in the wavelength between the paired surface emitting laser and the photo detector was obtained by the novel fabrication method in which the first and second stacked layers for both the surface emitting laser arrays and the photo detector arrays were grown in the successive growth steps for subsequent separation of the laser and photo detector sections by the wet etching. As illustrated in FIG. 1D, incidence of the laser beam into the photo detector is carried out through the second semiconductor substrate, while the laser emission from the surface emitting laser is carried out through the first semiconductor substrate.

The above novel fabrication method according to the present invention is applicable to the fabrication process for InP system semiconductor optical laser and photo detector arrays.

Whereas modifications of the present invention will no doubt be apparent to a person having ordinary skill in the art, to which the invention pertains, it is to be understood that the embodiments shown and described by way of illustration are by no means intended to be considered in a limiting sense. Accordingly, it is to be intended to cover by the claims all modifications of the invention which fall within the sprit and scope of the invention.

What is claimed is:

1. A method of fabricating two dimensional semiconductor surface emitting laser and photo detector arrays comprising the steps of:

growing a first stacked multiple layer structure for two dimensional surface emitting laser arrays on a first semiconductor substrate, said first stacked multiple layer structure having at least a predetermined thickness gradient;

growing an intermediate layer on said first stacked multiple layer structure, said intermediate layer being made of a semiconductor whose etching rate is much higher than an etching rate of the first stacked multiple layers;

growing a second stacked multiple layer structure for two dimensional photo detector arrays on said intermediate layer, said second stacked multiple layer structure having at least a predetermined thickness gradient;

adhering a second semiconductor substrate on a top of the second stacked multiple layer structure by a heat treatment thereby a wafer is grown in successive growth processes;

subjecting said wafer to a selective wet etching so that said intermediate layer only is selectively etched to separate said first and second stacked multiple layer structures from one another; and forming surface emitting laser arrays and photo detector arrays on said first and second semiconductor substrates respectively.

2. The method as claimed in claim 1, wherein said surface emitting lasers aligned in the two dimensional arrays shows a laser emission in different wavelengths to each other and said photo detectors aligned in the two dimensional arrays shows a laser detection in different wavelengths to each other, while each pair of surface emission laser and photo detector has the complete correspondent resonant wavelength.

3. The method as claimed in claim 1, wherein said heat treatment is carried out in $H^2$ atmosphere.

4. The method as claimed in claim 1, wherein said heat treatment is carried out at 500° C.

5. The method as claimed in claim 1, wherein said wet etching is carried out by use of 50% buffered HF.

6. The method as claimed in claim 1, wherein said intermediate layer is made of AlAs.

7. The method as claimed in claim 1, wherein said first stacked multiple layer structure is fabricated by the steps comprising:

growing a bottom distributed Bragg reflector comprising a plurality of periods of alternate AlAs/GaAs layers doped with a dopant of a first conductivity type;

growing an active layer made of $In_{0.2}Ga_{0.8}As$ on said bottom distributed Bragg reflector; and growing a top distributed Bragg reflector comprising a plurality of periods of alternate AlAs/GaAs layers doped with a dopant of a second conductivity type on said active layer.

8. The method as claimed in claim 7, wherein said second stacked multiple layer structure is fabricated by the steps comprising:

growing a bottom distributed Bragg reflector comprising a plurality of periods of alternate AlAs/GaAs layers doped with a dopant of said second conductivity type;

growing an absorption layer made of $In_{0.2}Ga_{0.8}As$ on said bottom distributed Bragg reflector; and growing a top distributed Bragg reflector comprising a plurality of periods of alternate AlAs/GaAs layers doped with a dopant of said first conductivity type on said active layer.

9. The method as claimed in claim 8, further comprising the step of:

forming a cover layer on said top distributed Bragg reflector; and removing said cover layer for subsequent adhesion of said second substrate.

* * * * *